(12) United States Patent
Joslyn

(10) Patent No.: US 6,413,834 B1
(45) Date of Patent: Jul. 2, 2002

(54) METHODS FOR ETCHING SILICON DIOXIDE; AND METHODS FOR FORMING ISOLATION REGIONS

(75) Inventor: Michael J. Joslyn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/639,525

(22) Filed: Aug. 15, 2000

(51) Int. Cl.⁷ .................. H01L 21/76; H01L 21/302
(52) U.S. Cl. .................. 438/424; 438/691; 438/692; 430/192
(58) Field of Search .................. 430/192; 438/424, 438/691, 692

(56) References Cited

U.S. PATENT DOCUMENTS 5,212,044 A * 5/1993 Liang et al. ............... 430/192
6,060,370 A * 5/2000 Hsia et al. ................. 438/424

OTHER PUBLICATIONS

Thin Film Processes, John L. Vossen et al Academic Press, inc. 1978 pp. 424, 425, 430.*
Handbook of Semiconductor Silicon Technology, O'Mara et al Noyes publishers 1990 p. 198.*

* cited by examiner

Primary Examiner—Olik Chaudhuri
Assistant Examiner—David S Blum
(74) Attorney, Agent, or Firm—Wells St. John P.S.

(57) ABSTRACT

The invention encompasses a semiconductor processing method in which silicon dioxide is etched with a solution that comprises an alkyl peroxide. An exemplary alkyl peroxide is methyl peroxide. The invention also encompasses a method of forming an isolation region. A patterned silicon nitride material is formed over a semiconductive substrate. The patterned silicon nitride material has an opening extending therethrough. The opening is further extended into the substrate underlying the silicon nitride material, and is then filled with silicon dioxide. Subsequently, the silicon dioxide is chemical-mechanical polished with a slurry having an alkyl peroxide therein.

31 Claims, 2 Drawing Sheets

METHODS FOR ETCHING SILICON DIOXIDE; AND METHODS FOR FORMING ISOLATION REGIONS

TECHNICAL FIELD

The invention pertains to methods for etching silicon dioxide, and in particular embodiments pertains to methods for altering the selectivity of an etch for silicon dioxide relative to silicon nitride. The invention also pertains to methods of forming isolation regions.

BACKGROUND OF THE INVENTION

Silicon dioxide materials are commonly used in fabrication of semiconductor devices. Accordingly, numerous semiconductor fabrication processes involve etching of silicon dioxide materials. Another commonly used material in semiconductor fabrication processes is silicon nitride. In various processes, it can be desired to adjust etch selectivity for silicon dioxide relative to silicon nitride. For purposes of interpreting this disclosure and the claims that follow, the term "etch selectivity" refers to a rate of removal of one material relative to another material. For instance, an etch which is selective for silicon dioxide relative to silicon nitride is defined as an etch which removes silicon dioxide faster than silicon nitride. Adjustment of etch selectivity is defined to mean alteration of the rate of an etch of one material relative to another material. For instance, adjustment of etch selectivity for silicon dioxide relative to silicon nitride means that the rate of removal of silicon dioxide relative to silicon nitride is either increased or decreased.

An exemplary prior art process wherein it can be desired to adjust etch selectivity for silicon dioxide relative to silicon nitride is described with reference to FIGS. 1–4. Referring initially to FIG. 1, a semiconductor wafer fragment 10 is illustrated. Wafer fragment 10 comprises a substrate 12 which can comprise, for example, monocrystalline silicon lightly doped with a background of p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A silicon dioxide layer 14 is formed over substrate 12, and a silicon nitride layer 16 is formed over silicon dioxide layer 14. Oxide 14 is provided to alleviate stresses that could occur if nitride 16 were placed directly on substrate 12. For purposes of interpreting this disclosure and the claims that follow, a layer referred to as a "silicon dioxide layer" is a layer which comprises silicon dioxide, but it not a layer which consists essentially of, or consists of, silicon dioxide unless such is stated explicitly. Also, a silicon nitride layer is a layer which comprises silicon nitride, but is not a layer which consists of, or consists essentially of, silicon nitride unless such is stated explicitly.

Silicon nitride layer 16 and silicon dioxide layer 14 are patterned and have an opening 18 extending therethrough. Silicon nitride layer 16 and silicon dioxide layer 14 can be patterned utilizing photoresist (not shown) and photolithographic processing.

Referring to FIG. 2, opening 18 is extended into substrate 12.

FIG. 3 shows an insulative material 20 formed within opening 18 a and over silicon nitride material 16. Insulative material 20 can comprise, for example, silicon dioxide.

Referring to FIG. 4, the silicon dioxide material 20 from FIG. 3 is subjected to an etch, such as, for example, chemical-mechanical polishing, to remove the silicon dioxide material 20 from over silicon nitride 16 while leaving material 20 within opening 18. The etch leaves an upper surface 22, which is intended to be a planarized upper surface. The material 20 remaining with opening 18 forms an isolation region, which can be utilized for electrically isolating conductive circuitry (not shown) formed over and/or within substrate 12.

A problem associated with the prior art processing is shown in FIG. 4 as a dishing of the top surface of material 20. Specifically, the chemical-mechanical polishing has removed silicon dioxide material 20 too rapidly relative to silicon nitride material 16, and has accordingly dished an upper surface of material 20, rather than forming a desired planarized upper surface. It would be desirable to develop methods wherein the selectivity of an etch for silicon dioxide relative to silicon nitride can be adjusted to alleviate or avoid the dishing shown in FIG. 4.

SUMMARY OF THE INVENTION

In one aspect, the invention encompasses a semiconductor processing method in which silicon dioxide is etched with a solution that comprises an alkyl peroxide. An exemplary alkyl peroxide is methyl peroxide.

In another aspect, the invention encompasses a method of forming an isolation region. A patterned silicon nitride material is formed over a semiconductive substrate. The patterned silicon nitride material has an opening extending therethrough. The opening is further extended into the substrate underlying the silicon nitride material, and is then filled with silicon dioxide. Subsequently, the silicon dioxide is chemical-mechanical polished with a slurry having an alkyl peroxide therein.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods for altering a rate of an etch of a silicon dioxide material. Specifically, the invention encompasses methods in which an alkyl peroxide, such as, for example, methyl peroxide, is incorporated into an etch solution to slow the rate of the etch for silicon dioxide. Other exemplary alkyl peroxides include ethyl peroxide, propyl peroxide, and butyl peroxide. The methodology of the present invention can be used for altering a selectivity of an etch. For instance, the methodology of the present invention can slow an etch relative to silicon dioxide while leaving a rate of the etch for silicon nitride substantially unchanged. Accordingly, the methodology of the present invention can alter the selectivity of the etch for silicon dioxide relative to silicon nitride.

An exemplary application for methodology of the present invention is described with reference to FIGS. 5 and 6. In referring to FIGS. 5 and 6, similar numbering will be used as was used above in describing the prior art FIGS. 1–4, with the suffix "a" used to indicate structures in FIGS. 5 and 6.

Figure 1:
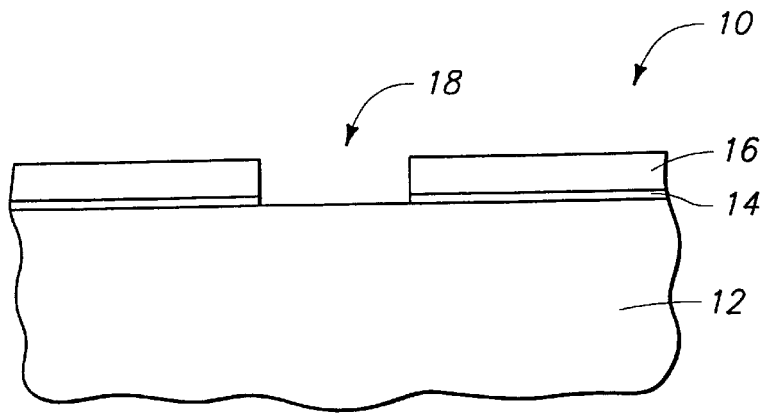
FIG. 1 is a diagrammatic, cross-sectional view of a semiconductor wafer fragment at a preliminary step of a prior art processing sequence.
Figure 2:
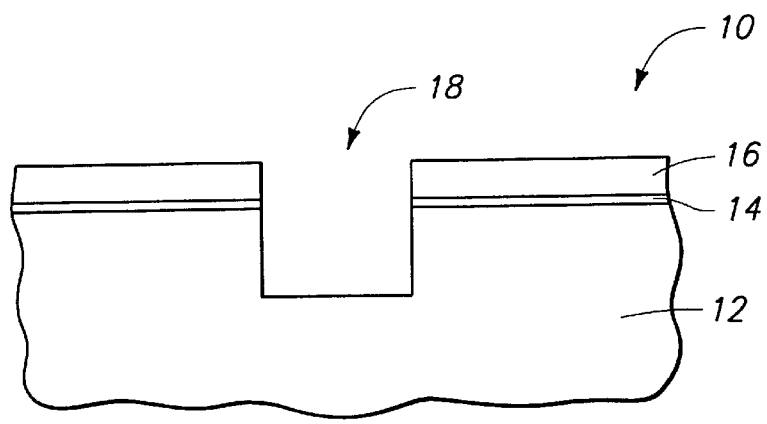
FIG. 2 is a view of the FIG. 1 wafer fragment shown at a prior art processing step subsequent to that of FIG. 1.
Figure 3:
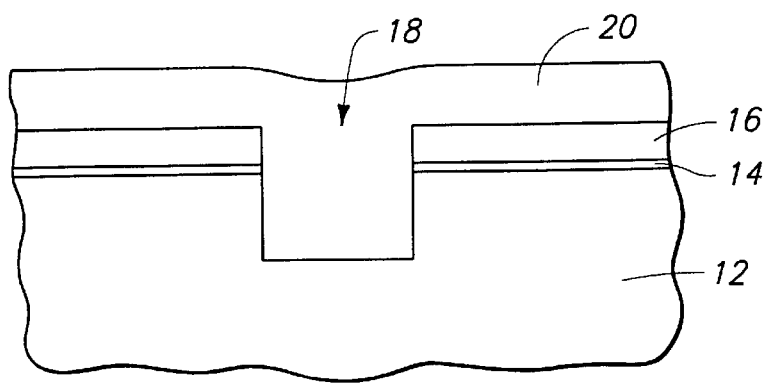
FIG. 3 is a view of the FIG. 1 wafer fragment shown at a prior art processing step subsequent to that of FIG. 2.
Figure 4:
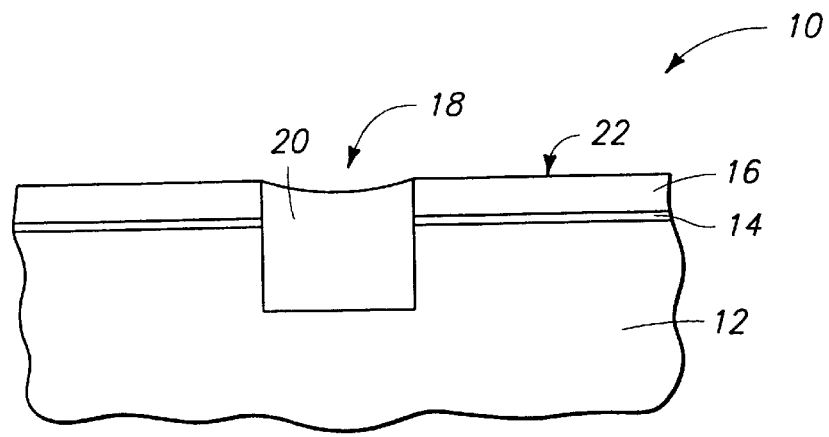
FIG. 4 is a view of the FIG. 1 wafer fragment shown at a prior art processing step subsequent to that of FIG. 3.
Figure 5:
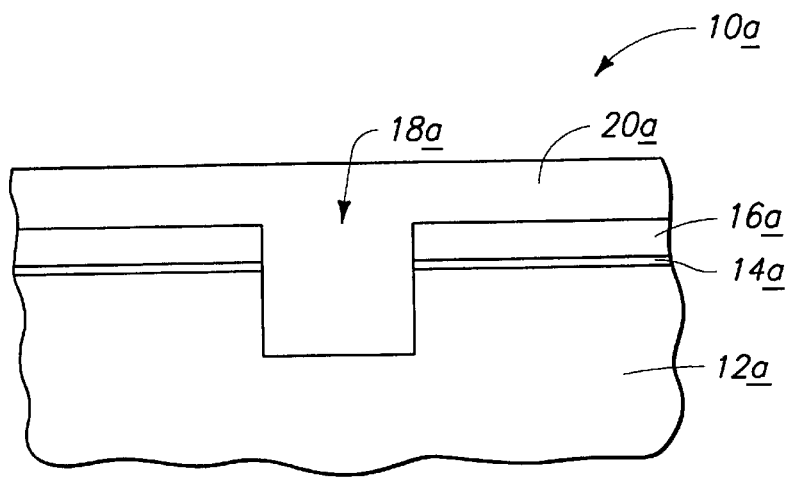
FIG. 5 is a view of a semiconductor wafer fragment shown at a preliminary processing step of the present invention.

Referring initially to FIG. 5, a wafer fragment 10a comprises a substrate 12a having a silicon dioxide layer 14a and a silicon nitride layer 16a thereover. An opening 18a extends into substrate 12a, and a silicon dioxide material 20a is formed over silicon nitride material 16a and within opening 18a. Materials 12a, 14a, 16a and 20a can comprise the same materials as described above relative to prior art FIGS. 1–4.

Figure 6:
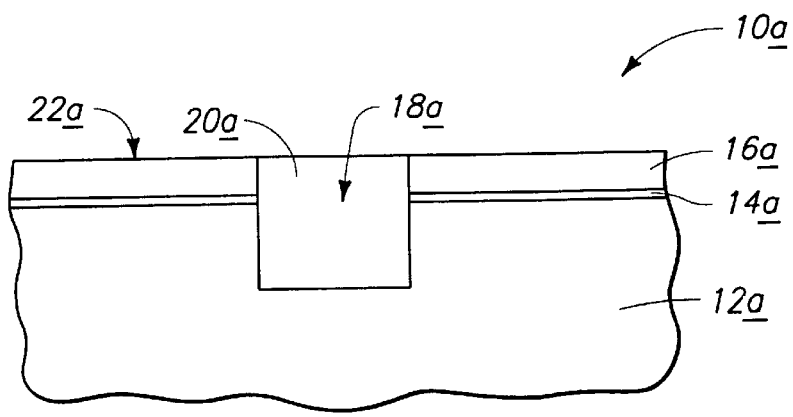
FIG. 6 is a view of the FIG. 5 wafer fragment shown at a processing step subsequent to that of FIG. 5.

Referring to FIG. 6, silicon dioxide material 20a is chemical-mechanical polished with a slurry comprising an alkyl peroxide therein to form a planarized upper surface 22a. The chemical-mechanical polishing slurry comprises an alkyl peroxide in addition to the components of a prior art chemical-mechanical slurry, and such slows a rate of an etch for silicon dioxide relative to the rate of polishing of the silicon nitride material. Accordingly, the etch has avoided the dip formation of prior art FIG. 4, and instead formed a planarized upper surface which extends across both nitride layer 16a and the remaining material 20a in opening 18a. An exemplary polishing slurry can comprise an aqueous basic or acidic solution, such as aqueous potassium hydroxide. The polishing solution can further contain dispersed particles, such as silica or aluminum. The polishing solution can comprise conventional polishing solutions utilized in the prior art processing such as that described with reference to FIGS. 1–4, with the addition of an alkyl peroxide. The alkyl peroxide can be provided to a concentration of from greater than 0 weight percent to about 30 weight percent, such as, for example, a concentration of from about 5 weight percent to less than or equal to about 10 weight percent. The polishing can occur at conventional temperatures and pressures, and for conventional time periods. An exemplary temperature is from about 20° C. to about 45° C.

The alkyl peroxide can be provided in a polishing solution at the initiation of an polishing process, and/or can be provided at various intervals (or continuously) during the polishing process. The alkyl peroxide provided during a polishing process can compensate for losses of alkyl peroxide occurring in a polishing solution due to breakdown of the alkyl peroxide. Specifically, alkyl peroxides may have a lifetime in a polishing solution that is less than the time of a polishing process. The addition of alkyl peroxide into a polishing solution during a polishing process can maintain a desired concentration of the alkyl peroxide in the solution during the time of the polish, and can accordingly compensate for the short lifetime of the alkyl peroxide in the polishing solution.

Although the invention is described with reference to a chemical-mechanical polishing process, it is to be understood that the invention encompasses addition of an alkyl peroxide to other processes for chemically etching silicon dioxide. A possible mechanism by which the alkyl peroxide can slow etching of silicon dioxide is by modification of a surface of the silicon dioxide, and specifically through reaction with dangling bonds of the silicon dioxide. Accordingly, the utilization of an alkyl peroxide to slow etching of silicon dioxide can be applicable for a number of silicon dioxide etches. The mechanism provided herein is provided to assist the reader in understanding the present invention, and is not intended to limit the present invention. Further, the mechanism is to be understood as a proposed mechanism, and regardless of whether the mechanism is ultimately determined to be the actual mechanism by which an alkyl peroxide slows etching of silicon dioxide, the processes of the present invention remain effective for altering an etch rate of silicon dioxide.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted, in accordance with the doctrine of equivalents.

What is claimed is:

1. A semiconductor processing method comprising etching silicon dioxide with a solution comprising an alkyl peroxide.

2. The method of claim 1 wherein the alkyl peroxide is methyl peroxide.

3. The method of claim 1 wherein the alkyl peroxide is provided in the solution to a concentration of from greater than 0 weight percent to less than or equal to about 30 weight percent during the etching.

4. The method of claim 1 wherein the alkyl peroxide is methyl peroxide, and is provided in the solution to a concentration of from greater than 0 weight percent to less than or equal to about 30 weight percent during the etching.

5. The method of claim 1 wherein the alkyl peroxide is provided in the solution to a concentration of from greater than or equal to about 5 weight percent to less than or equal to about 10 weight percent during the etching.

6. The method of claim 1 wherein the alkyl peroxide is methyl peroxide, and is provided in the solution to a concentration of from greater than or equal to about 5 weight percent to less than or equal to about 10 weight percent during the etching.

7. The method of claim 1 wherein the alkyl peroxide is added continuously to the solution during the etching of the silicon dioxide.

8. The method of claim 1 wherein the alkyl peroxide is methyl peroxide and is added continuously to the solution during the etching of the silicon dioxide.

9. The method of claim 1 wherein the alkyl peroxide is added at intervals to the solution during the etching of the silicon dioxide.

10. The method of claim 1 wherein the alkyl peroxide is methyl peroxide and is added at intervals to the solution during the etching of the silicon dioxide.

11. A semiconductor processing method, comprising:
   providing a substrate having silicon dioxide and silicon nitride thereover; and
   exposing the silicon dioxide and silicon nitride to an etching solution to remove at least some of the silicon dioxide selectively relative to the silicon nitride; the etching solution comprising an alkyl peroxide.

12. The method of claim 11 wherein the alkyl peroxide is methyl peroxide.

13. The method of claim 11 wherein the etching solution is a chemical-mechanical polishing solution.

14. The method of claim 11 wherein the alkyl peroxide is added continuously to the solution during the removing of the silicon dioxide.

15. The method of claim 11 wherein the alkyl peroxide is methyl peroxide and is added continuously to the solution during the removing of the silicon dioxide.

16. The method of claim 11 wherein the alkyl peroxide is added at intervals to the solution during the removing of the silicon dioxide.

17. The method of claim 11 wherein the alkyl peroxide is methyl peroxide and is added at intervals to the solution during the removing of the silicon dioxide.

18. The method of claim 11 wherein the alkyl peroxide is provided in the solution to a concentration of from greater than 0 weight percent to less than or equal to about 30 weight percent during the removing of the silicon dioxide.

19. The method of claim 11 wherein the alkyl peroxide is methyl peroxide, and is provided in the solution to a concentration of from greater than 0 weight percent to less than or equal to about 30 weight percent during the removing of the silicon dioxide.

20. The method of claim 11 wherein the alkyl peroxide is provided in the solution to a concentration of from greater than or equal to about 5 weight percent to less than or equal to about 10 weight percent during the removing of the silicon dioxide.

21. The method of claim 11 wherein the alkyl peroxide is methyl peroxide, and is provided in the solution to a concentration of from greater than or equal to about 5 weight percent to less than or equal to about 10 weight percent during the removing of the silicon dioxide.

22. A semiconductor processing method of forming an isolation region, comprising:

forming a patterned silicon nitride material over a semiconductor substrate, the patterned silicon nitride material having an opening extending therethrough;

extending the opening from the patterned silicon nitride material into the substrate;

filling the extended opening with silicon dioxide; and chemical-mechanical polishing the silicon dioxide with a slurry having an alkyl peroxide therein.

23. The method of claim 22 wherein the alkyl peroxide is methyl peroxide.

24. The method of claim 22 wherein the alkyl peroxide is added continuously to the slurry during the chemical-mechanical polishing.

25. The method of claim 22 wherein the alkyl peroxide is methyl peroxide and is added continuously to the slurry during the chemical-mechanical polishing.

26. The method of claim 22 wherein the alkyl peroxide is added at intervals to the slurry during the chemical-mechanical polishing.

27. The method of claim 22 wherein the alkyl peroxide is methyl peroxide and is added at intervals to the slurry during the chemical-mechanical polishing.

28. The method of claim 22 wherein the alkyl peroxide is provided in the solution to a concentration of from greater than 0 weight percent to less than or equal to about 30 weight percent during the chemical-mechanical polishing.

29. The method of claim 22 wherein the alkyl peroxide is methyl peroxide, and is provided in the solution to a concentration of from greater than 0 weight percent to less than or equal to about 30 weight percent during the chemical-mechanical polishing.

30. The method of claim 22 wherein the alkyl peroxide is provided in the solution to a concentration of from greater than or equal to about 5 weight percent to less than or equal to about 10 weight percent during the chemical-mechanical polishing.

31. The method of claim 22 wherein the alkyl peroxide is methyl peroxide, and is provided in the solution to a concentration of from greater than or equal to about 5 weight percent to less than or equal to about 10 weight percent during the chemical-mechanical polishing.

* * * * *

UNITED STATES PATENT AND TRADEMARK OFFICE
CERTIFICATE OF CORRECTION

PATENT NO. : 6,413,834 B1
DATED : July 2, 2002
INVENTOR(S) : Michael J. Joslyn

It is certified that error appears in the above-identified patent and that said Letters Patent is hereby corrected as shown below:

Column 1,
Line 55, replace "it" with -- is --.

Column 2,
Line 2, replace "18 a" with -- 18 --.

Signed and Sealed this

Eighteenth Day of February, 2003

JAMES E. ROGAN
*Director of the United States Patent and Trademark Office*